(12) United States Patent
Takiguchi

(10) Patent No.: US 8,233,515 B2
(45) Date of Patent: Jul. 31, 2012

(54) OPTICAL WAVEGUIDE INTEGRATED SEMICONDUCTOR OPTICAL DEVICE

(75) Inventor: Tohru Takiguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 12/713,215

(22) Filed: Feb. 26, 2010

(65) Prior Publication Data

US 2011/0002352 A1      Jan. 6, 2011

(30) Foreign Application Priority Data

Jul. 2, 2009   (JP) ................. 2009-157479

(51) Int. Cl.
*H01S 3/04*   (2006.01)
*H01S 5/00*   (2006.01)

(52) U.S. Cl. ............. 372/46.01; 372/50.11; 372/43.01
(58) Field of Classification Search .............. 372/46.01, 372/50.11, 43.01
See application file for complete search history.

(56) References Cited

U.S. PATENT DOCUMENTS

| 5,679,603 | A | * | 10/1997 | Kimura et al. ............. 117/104 |
| 5,978,402 | A | * | 11/1999 | Matsumoto et al. ......... 372/50.1 |
| 6,477,283 | B1 | * | 11/2002 | Shimizu et al. ............. 385/3 |
| 7,116,693 | B2 | * | 10/2006 | Hata et al. ................ 372/46.01 |
| 2002/0014674 | A1 | * | 2/2002 | Hideyoshi et al. ......... 257/458 |

FOREIGN PATENT DOCUMENTS

| JP | 59-129473 A | 7/1984 |
| JP | 62-219590 A | 9/1987 |
| JP | 63-186210 A | 8/1988 |
| JP | 1-192184 A | 8/1989 |
| JP | 5-226633 A | 9/1993 |
| JP | 7-7226 A | 1/1995 |
| JP | 10-173291 A | 6/1998 |

OTHER PUBLICATIONS

Aoki et al., "A 1310-nm InGaAIAs Short-Cavity DBR laser for 100° C, 10-Gbit/s Operations with a 14-mA$_{pp}$ Current Drive", *ECOC 2005 Proceedings*, vol. 2, Paper Tu4.5.1 pp. 293-294.

* cited by examiner

*Primary Examiner* — Patrick Stafford
(74) *Attorney, Agent, or Firm* — Leydig, Voit & Mayer, Ltd.

(57) ABSTRACT

An optical waveguide integrated semiconductor optical device includes a laser and an optical waveguide. The laser includes an active layer and a first cladding layer which are stacked on a second cladding layer. The optical waveguide includes an optical guiding layer and an undoped InP layer which are also stacked on the second cladding layer. A high resistance layer is located between the top surface of the optical guiding layer and a surface of the undoped InP layer and between a side of the first cladding layer and a side of the undoped InP layer.

11 Claims, 14 Drawing Sheets

A-A

C-C

OPTICAL WAVEGUIDE INTEGRATED SEMICONDUCTOR OPTICAL DEVICE

FIELD OF THE INVENTION

The present invention relates to an optical waveguide integrated semiconductor optical device and a manufacturing method therefor.

BACKGROUND ART

Integrated semiconductor optical devices have been known in which an optical active device and an optical modulator are integrated on a substrate, as disclosed in, e.g., Japanese Laid-Open Patent Publication 10-173291 (1998). It is generally preferred that the plurality of integrated components in an integrated semiconductor optical device be electrically separated from one another. In this connection, the integrated semiconductor optical device disclosed in the above publication includes a separating trench formed between the semiconductor laser and the modulator. A semi-insulating semiconductor layer is formed buried in this separating trench. In this way the semiconductor laser is electrically separated from the optical modulator.

Other prior art includes Japanese Laid-Open Patent Publication Nos. 7-7226 (1995), 63-186210 (1988), 62-219590 (1987), 5-226633 (1993), 1-192184 (1989), and 59-129473 (1984).

There is the type of integrated semiconductor optical device which includes an integrated optical active device and an integrated optical waveguide. The optical waveguide includes an optical guiding layer and two cladding layer sandwiching the optical guiding layer therebetween. It will be noted that in an integrated structure including an optical active device and an optical waveguide, if a side of a cladding layer of the optical waveguide is in contact with the optical active device, a current path may be formed between the optical active device and the optical waveguide side through that cladding layer. If a current leaks from the optical active device to the optical waveguide side through this current path, a degradation in the characteristics of the optical active device may result.

SUMMARY OF THE INVENTION

The present invention has been made to solve the above problem. It is, therefore, an object of the present invention to provide an optical waveguide integrated semiconductor optical device which has an optical active device portion and an optical waveguide portion and which is constructed so as to reduce the leakage current from the optical active device portion. Another object of the present invention is to provide a method for manufacturing such an optical waveguide integrated semiconductor optical device.

According to a first aspect of the present invention, an optical waveguide integrated semiconductor optical device includes a semiconductor substrate, an optical active device portion, an optical waveguide portion and a high resistance layer. The optical active device portion is provided on the semiconductor substrate. The optical waveguide portion is provided on the semiconductor substrate adjacent the optical active device portion and the optical waveguide portion includs a first cladding layer, an optical guiding layer, and a second cladding layer stacked on the semiconductor substrate in that order. The optical waveguide portion is such that the optical guiding layer is in contact and optically coupled with the optical active device portion. The high resistance layer is made of a material higher in electrical resistivity than the material of the second cladding layer and the high resistance layer extends across a first interface between the second cladding layer and the optical guiding layer and a second interface between the second cladding layer and the optical active device portion.

According to a second aspect of the present invention, an optical waveguide integrated semiconductor optical device includes a semiconductor substrate, an optical active device portion and an optical waveguide portion. The optical active device portion is provided on the semiconductor substrate. The optical waveguide portion is provided on the semiconductor substrate adjacent the optical active device portion. The optical waveguide portion inclus a first cladding layer, an optical guiding layer, and a second cladding layer of a semi-insulating semiconductor material stacked in that order. The optical waveguide portion is such that the optical guiding layer is in contact and optically coupled with the optical active device portion.

According to a third aspect of the present invention, a method for manufacturing an optical waveguide integrated semiconductor optical device, includes the steps of:

forming a laminated structure including a first cladding layer, an active layer, a second cladding layer, stacked on a semiconductor substrate in that order;

forming an optical guiding layer either on a region of the top surface of the first cladding layer adjacent the active layer or on another cladding layer formed on the semiconductor substrate adjacent the first cladding layer such that an end face of the optical guiding layer is in contact with an end face of the active layer;

epitaxially growing a layer of material on the top surface of the optical guiding layer and on a side of the second cladding layer, the layer of material being higher in electrical resistivity than the material of a third cladding layer to be subsequently formed on the optical guiding layer;

forming the third cladding layer on the layer formed by the epitaxial growth step;

forming an optical active device portion from the laminated structure including the first cladding layer, the active layer, and the second cladding layer; and forming an optical waveguide portion from the optical guiding layer formed adjacent the laminated structure, the layer formed by the epitaxial growth step, and the third cladding layer.

Thus, in the optical waveguide integrated semiconductor optical device of the first aspect of the present invention, the high resistance layer prevents the flow of current between the optical active device portion and the optical guiding layer, thereby allowing a reduction in the leakage current from the optical active device portion.

In the optical waveguide integrated semiconductor optical device of the second aspect of the present invention, the second cladding layer of a semi-insulating semiconductor material prevents the flow of current between the optical active device portion and the optical guiding layer, thereby allowing a reduction in the leakage current from the optical active device portion.

The method of the third aspect of the present invention manufactures an optical waveguide integrated semiconductor optical device in which a high resistance layer is provided between an optical active device portion and an optical guiding layer. This high resistance layer prevents current leakage, thereby allowing a reduction in the leakage current from the optical active device portion.

Other and further objects, features and advantages of the invention will appear more fully from the following description.

DETAILED DESCRIPTION OF THE PREFERRED EMBODIMENTS

First Embodiment

Configuration of First Embodiment

Figure 1:
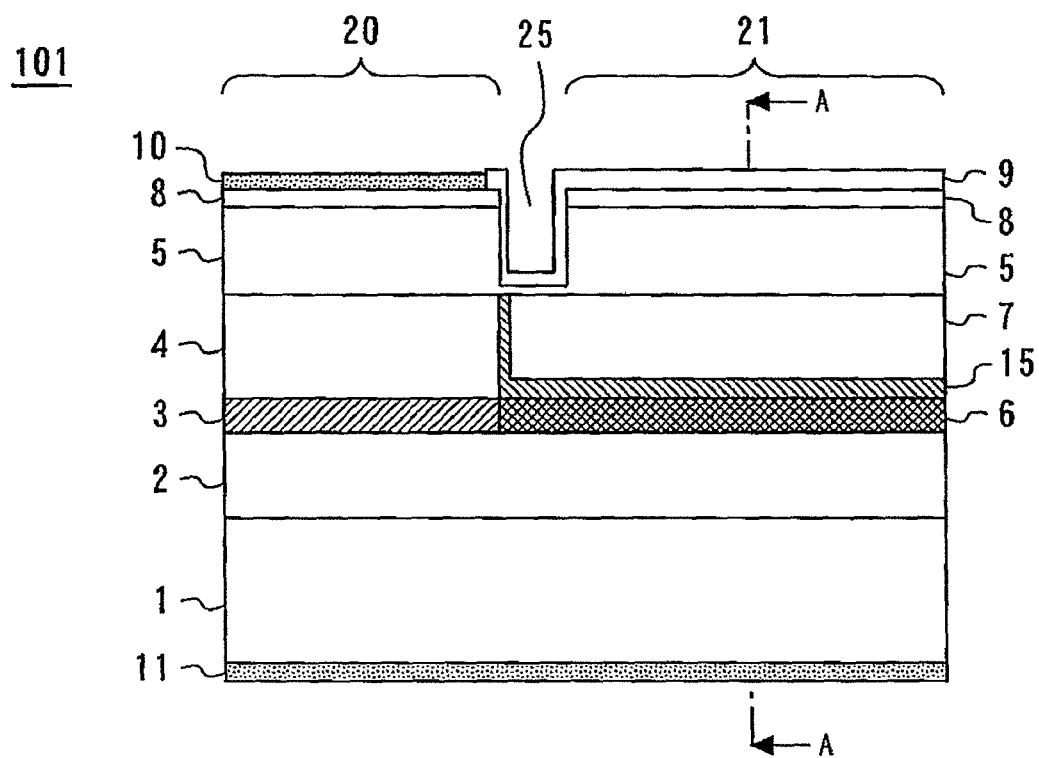
FIG. 1 is a diagram showing the configuration of an optical waveguide integrated semiconductor optical device according to a first embodiment of the present invention.

FIG. 1 is a diagram showing the configuration of an optical waveguide integrated semiconductor optical device 101 (hereinafter also referred to simply as "semiconductor optical device 101") according to a first embodiment of the present invention. The semiconductor optical device 101 of the first embodiment is an integrated semiconductor optical device including an integrated semiconductor laser and an integrated optical waveguide. FIG. 1 shows a cross section of the semiconductor optical device 101 taken parallel to the direction of propagation of the laser beam. As shown in FIG. 1, the semiconductor optical device 101 includes a laser portion 20 and an optical waveguide portion 21. Thus, FIG. 1 shows a cross-sectional view of the semiconductor optical device 101 taken in the direction of the resonator.

As shown in FIG. 1, the semiconductor optical device 101 includes a semiconductor substrate 1 which is a P-type InP substrate. A cladding layer 2, an active layer 3, and a cladding layer 4 are stacked on the semiconductor substrate 1. The cladding layer 2 is a P-type InP cladding layer (having a P-type carrier concentration of $1 \times 10^{18}$ cm$^{-3}$) The active layer 3 is an AlGaInAs strained quantum well active layer. The cladding layer 4 is an N-type InP cladding layer (having an N-type carrier concentration of $1 \times 10^{18}$ cm$^{-3}$).

On the other hand, an optical guiding layer 6, a high resistance layer 15, and an undoped InP layer 7 are stacked in succession on the cladding layer 2 adjacent the laminated structure made up of the active layer 3 and the cladding layer 4 described above. The optical guiding layer 6 is an InGaAsP optical guiding layer. An end face of the active layer 3 is in contact with an end face of the optical guiding layer 6. The laser beam from the active layer 3 propagates through the optical guiding layer 6 toward the right side of FIG. 1.

The high resistance layer 15 continuously covers the top surface of the optical guiding layer 6 and a side of the cladding layer 4. That is, the high resistance layer 15 continuously extends across the interfaces between the undoped InP layer 7 and the top surface of the optical guiding layer 6 and between the undoped InP layer 7 and the side of the cladding layer 4. In the present embodiment the high resistance layer 15 is an Al(Ga)InAs layer. Al(Ga)InAs layers have lower mobility and hence higher electrical resistivity than InP layers. The Al(Ga)InAs layer serving as the high resistance layer 15 may be n-doped, undoped, p-doped, Fe-doped, or oxygen-doped. However, the electrical resistivities of the resulting doped Al(Ga)InAs layers are progressively higher in the order named.

An InP layer 5 and a contact layer 8 are stacked on the cladding layer 4 and on the undoped InP layer 7. The InP layer 5 is an N-type InP layer (having an N-type carrier concentration of $1\times10^{18}$ cm$^{-3}$). The contact layer 8 is an N-type InP contact layer (having an N-type carrier concentration of $1\times10^{19}$ cm$^{-3}$). The semiconductor optical device 101 also includes a separating trench 25.

In this configuration an N-type electrode 10 is formed on the left side of the separating trench 25, as viewed in FIG. 1. The N-type electrode 10 is made of Ti/Pt/Au. Referring to FIG. 1, an insulating film 9 is provided to the right of the N-type electrode 10. The insulating film 9 is an SiO$_2$ insulating film. The inner surfaces of the separating trench 25 are also covered with the insulating film 9. Further, a P-type electrode 11 is provided over the bottom surface of the semiconductor substrate 1. The P-type electrode 11 is made of Ti/Pt/Au.

Referring to FIG. 1, in the semiconductor optical device 101 configured as described above, the structure on the left side of the separating trench 25 functions as the laser portion 20, and the structure on the right side of the separating trench 25 functions as the optical waveguide portion 21.

Figure 2:
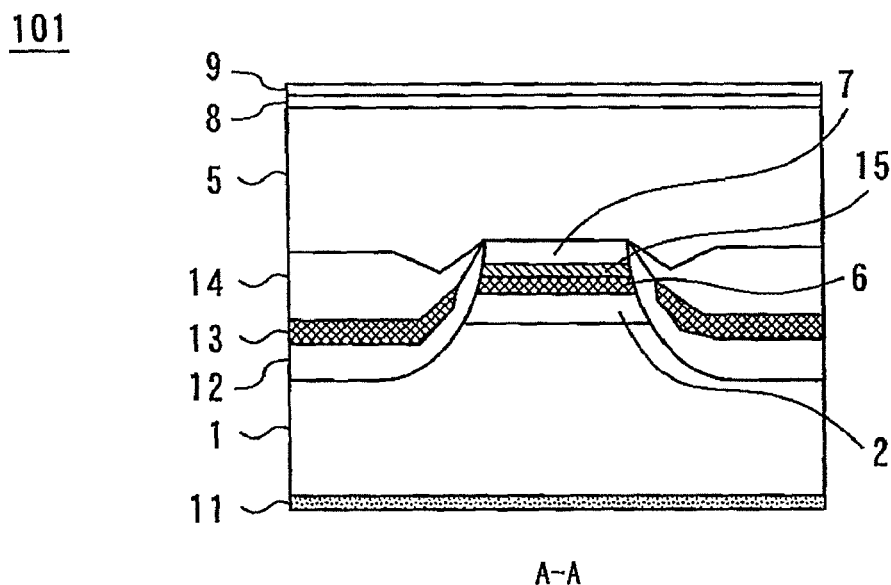
FIG. 2 shows a cross section of the semiconductor optical device taken along line A-A of FIG. 1 according to the first embodiment of the present invention.

FIG. 2 shows a cross section of the semiconductor optical device 101 taken along line A-A of FIG. 1. That is, FIG. 2 is a cross-sectional view of the optical waveguide portion 21 shown in FIG. 1 taken perpendicular to the direction of the resonator. As shown in FIG. 2, the optical waveguide portion 21 of the semiconductor optical device 101 includes buried layers 12, 13, and 14. The buried layer 12 is a P-type InP buried layer (having a P-type carrier concentration of $1\times10^{18}$ cm$^{-3}$). The buried layer 13 is an N-type InP buried layer (having an N-type carrier concentration of $1\times10^{19}$ cm$^{-3}$). The buried layer 14 is an Fe-doped InP buried layer (having an Fe concentration of $4\times10^{16}$ cm$^{-3}$).

Operation and Effect of First Embodiment

The operation of the semiconductor optical device 101 will now be described. When a current is injected into the laser portion 20, electrons flow from the cladding layer 4 to the active layer 3 in which the electrons combine with holes, with the result that a laser beam is emitted from an end face of the active layer 3. The emitted laser beam passes through the optical guiding layer 6 toward the right side of FIG. 1 and eventually exits the device.

Figure 14:
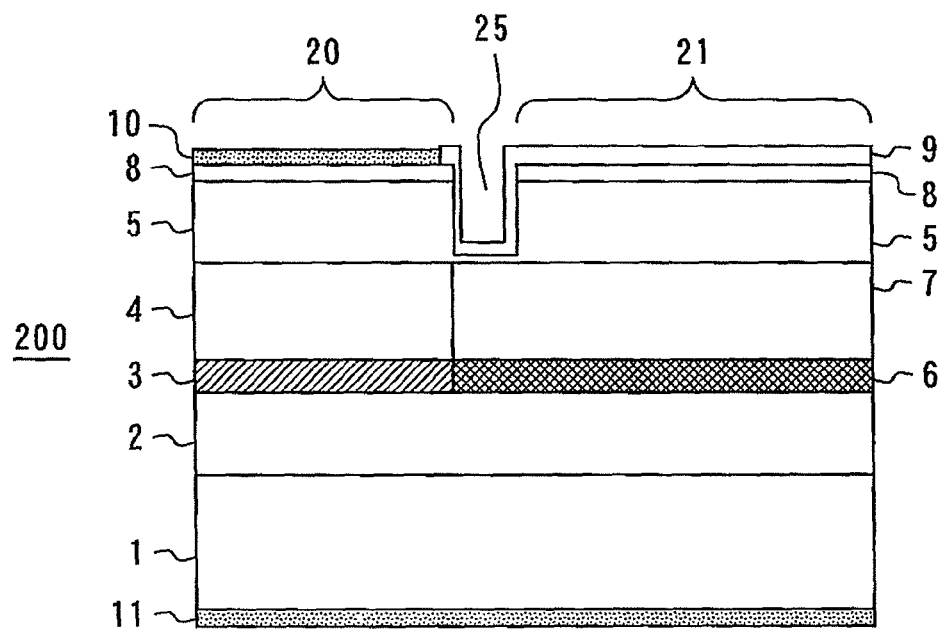
FIG. 14 is a diagram showing the configuration of an optical waveguide integrated semiconductor optical device according to a comparative example.
Figure 15:
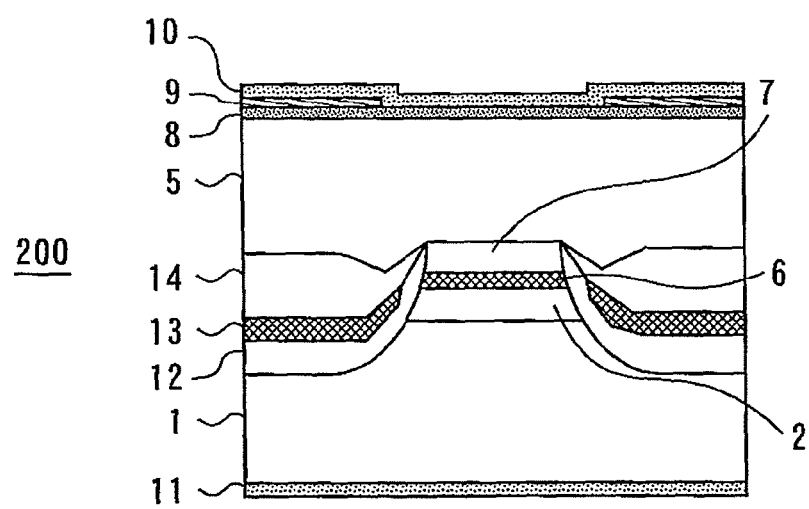
FIG. 15 is a diagram showing the configuration of an optical waveguide integrated semiconductor optical device according to a comparative example.
Figure 16:
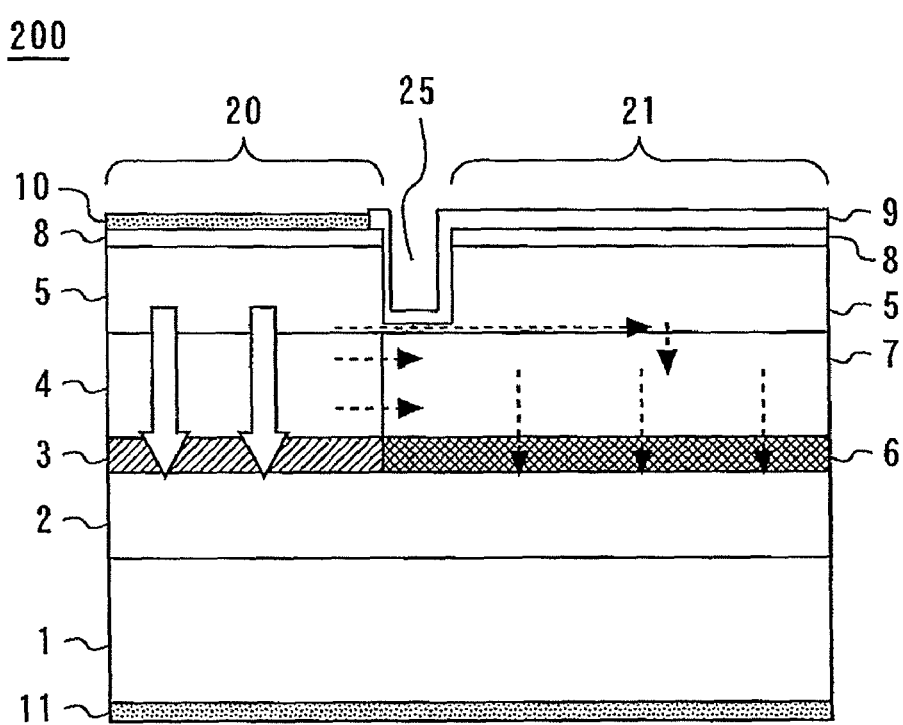
FIG. 16 is a diagram showing the configuration of an optical waveguide integrated semiconductor optical device according to a comparative example.

The effect of the high resistance layer 15 will be described by way of comparison with a comparative conventional device. FIGS. 14 to 16 show the configuration of an optical waveguide integrated semiconductor optical device 200 (hereinafter referred to simply as "semiconductor optical device 200") serving as a comparative example. This comparative semiconductor optical device 200 does not include the high resistance layer 15 as does the semiconductor optical device 101 of the first embodiment. FIG. 14 is a cross-sectional view corresponding to that of FIG. 1, showing the position of each component of the semiconductor optical device 200 as compared with the semiconductor optical device 101. FIG. 15 is a cross-sectional view corresponding to that of FIG. 2, showing the position of each component of the semiconductor optical device 200 as compared with the semiconductor optical device 101. In this semiconductor optical device 200, when a current is injected into the laser portion 20, electrons flow as indicated by arrowed thick lines in FIG. 16 and combine with holes in the active layer, thereby emitting a laser beam. At that time, some of the electrons flow to the optical waveguide portion 21 side, as indicated by arrowed broken lines. The resulting current does not contribute to the generation of the laser beam, thus constituting a leakage current component. This current leakage degrades the current-optical output characteristics of the laser portion 20.

On the other hand, the semiconductor optical device 101 of the first embodiment includes the high resistance layer 15. The high resistance layer 15 can block both the flow of electrons from the cladding layer 4 to the undoped InP layer 7 and the flow of electrons from the undoped InP layer 7 to the optical guiding layer 6. This allows a reduction in the leakage current, thereby preventing degradation of the current-optical output characteristics of the laser portion 20.

It should be noted that in the present embodiment the high resistance layer 15 is an Al(Ga)InAs layer. An oxygen-doped Al(Ga)InAs layer is preferably used as the high resistance layer 15, since it has high electrical resistivity. The oxygen doping may be accomplished by flowing oxygen gas into the furnace when the Al(Ga)InAs layer is grown by MOCVD (metalorganic organic chemical vapor deposition). However, flowing oxygen gas into an MOCVD furnace is undesirable, since it causes a problem with equipment maintenance. To avoid this problem, the Al(Ga)InAs layer may be formed to have a low V/III ratio so that the layer can be doped with oxygen without flowing oxygen gas into the MOCVD furnace. This allows an oxygen-doped Al(Ga)InAs layer to be formed as the high resistance layer 15 while avoiding the maintenance problem with the MOCVD equipment. According to the first embodiment, the V/III ratio of the Al(Ga)InAs layer is preferably 100 or less. However, the V/III ratio of the Al(Ga)InAs layer may be higher than 100, since the present embodiment requires only that the ratio be low enough that the layer can be doped with oxygen without flowing oxygen gas into the MOCVD furnace.

The following should be noted: the semiconductor substrate 1 of the first embodiment described above corresponds to the semiconductor substrate of the first aspect of the present invention described in the Summary of the Invention section; the laser portion 20, the optical active device portion; the optical waveguide portion 21, the optical waveguide portion; and the high resistance layer 15, the high resistance layer.

Further, the cladding layer 2 of the first embodiment corresponds to the first cladding layer of the first aspect of the present invention; the optical guiding layer 6, the optical guiding layer; and the undoped InP layer 7, the second cladding layer. That is, the cladding layer 2 of the first embodiment corresponds to both the first cladding layer of the optical waveguide portion of the first aspect and the optical active device portion of the first aspect.

Manufacturing Method of First Embodiment

A method for manufacturing the semiconductor optical device 101 according to the first embodiment will now be described with reference to FIGS. 3 to 13. FIGS. 3 to 13 show a process flow for manufacturing the semiconductor optical device 101.

Figure 3:
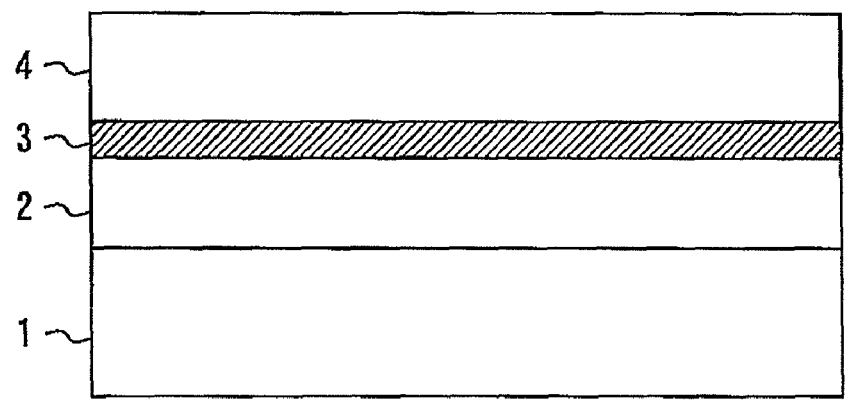
FIG. 3 show a process flow for manufacturing the semiconductor optical device according to the first embodiment of the present invention.

As shown in FIG. 3, a P-type InP layer (which is or will become the cladding layer 2) is grown in crystal form on a P-type InP semiconductor substrate 1 by MOCVD. Further, an AlGaInAs strained quantum well active layer (which is or will become the active layer 3) and an N-type InP layer (which is or will become the cladding layer 4) are grown in crystal form over the cladding layer 2.

Figure 4:
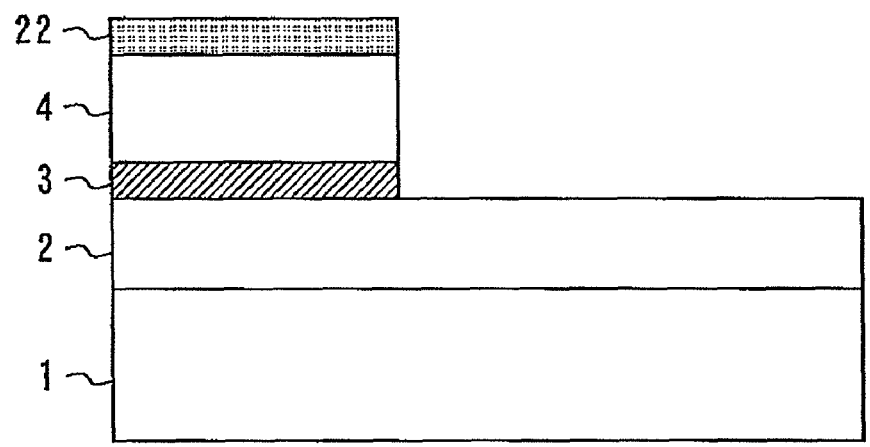
FIG. 4 show a process flow for manufacturing the semiconductor optical device according to the first embodiment of the present invention.

Then as shown in FIG. 4, an SiO$_2$ insulating film 22 is formed on the cladding layer 4 and then patterned and dry etched so as to remove the right portions of the active layer 3 and the cladding layer 4, as viewed in FIG. 4. An InGaAsP layer (which is or will become the optical guiding layer 6) is to be subsequently formed where the etched away portions were located.

Figure 5:
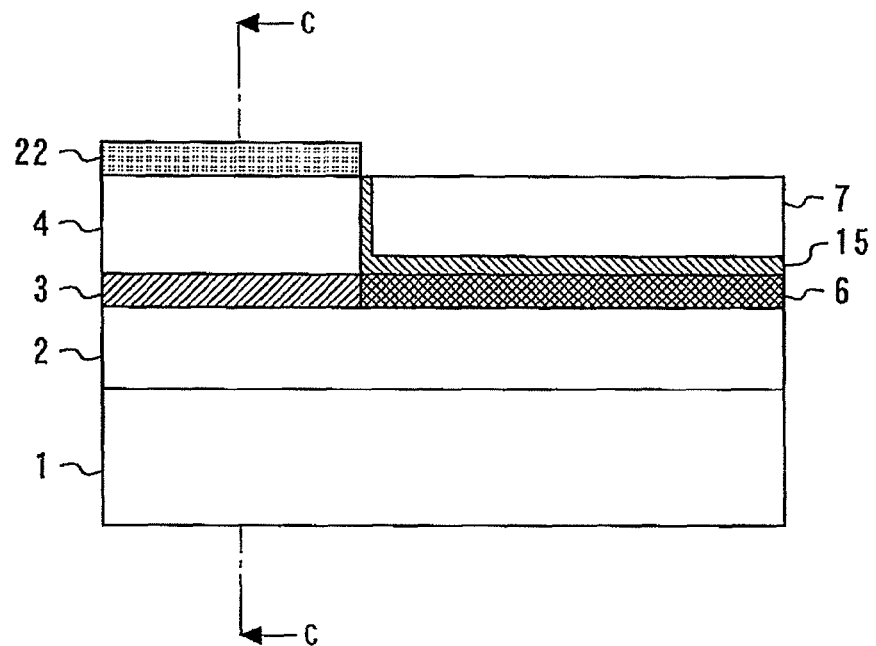
FIG. 5 show a process flow for manufacturing the semiconductor optical device according to the first embodiment of the present invention.
Figure 6:
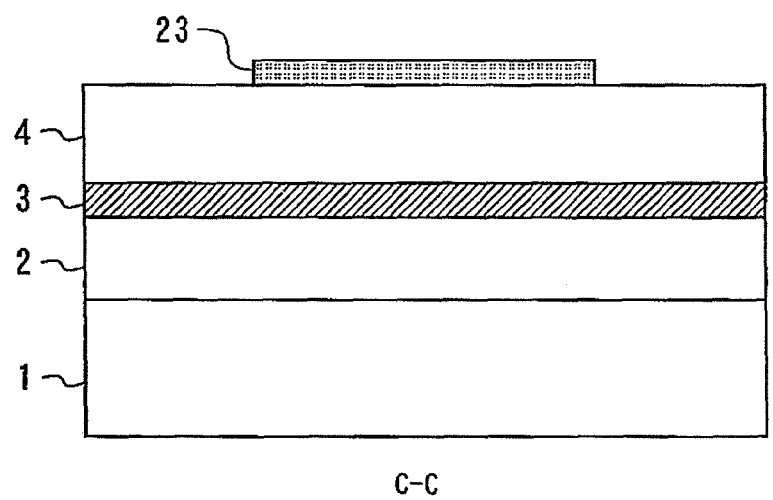
FIG. 6 show a process flow for manufacturing the semiconductor optical device according to the first embodiment of the present invention.

The InGaAsP layer (which is or will become the optical guiding layer 6) is then formed by MOCVD, as shown in FIG. 5. Further, an Al(Ga)InAs layer (which is or will become the high resistance layer 15) is formed on the top surface of the optical guiding layer 6 and on a side of the cladding layer 4 by MOCVD. Thus, the high resistance layer 15 covers the top surface of the optical guiding layer 6 and the side of the cladding layer 4, thereby providing a function to block the leakage current path.

Further, according to the manufacturing method of the first embodiment, the Al(Ga)InAs layer serving as the high resistance layer 15 is formed to have a V/III ratio of 100 or less. This allows the Al(Ga)InAs layer to be doped with oxygen without flowing oxygen gas into the MOCVD furnace.

Instead of adjusting its V/III ratio, the Al(Ga)InAs layer may be grown at a low growth temperature (e.g., 600 ΩC or less) so that the layer is doped with oxygen without flowing oxygen gas in the furnace.

After the formation of the high resistance layer 15, the undoped InP layer 7 is grown by MOCVD.

The process flow will be further described with reference to FIGS. 6 to 9. FIGS. 6 to 9 show cross sections of device structures at subsequent steps in manufacturing the semiconductor optical device 101, where these cross sections are taken alone a line corresponding to the line C-C of FIG. 5. That is, FIGS. 6 to 9 are cross-sectional views of structures in which the laser portion 20 is to be formed, where these cross-sectional views are taken in a plane perpendicular to the direction of the resonator.

Figure 7:
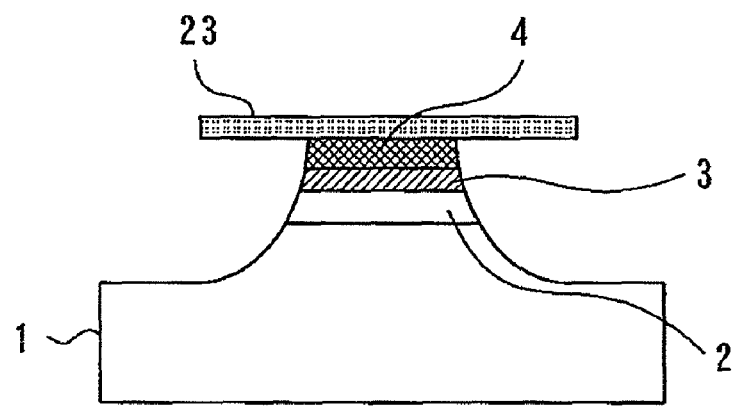
FIG. 7 show a process flow for manufacturing the semiconductor optical device according to the first embodiment of the present invention.
Figure 8:
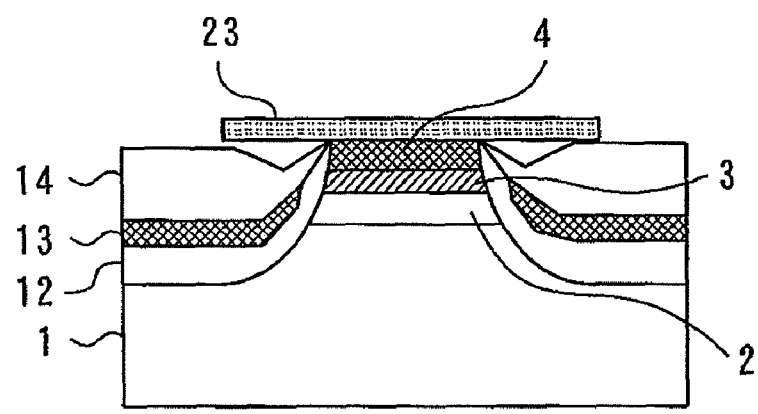
FIG. 8 show a process flow for manufacturing the semiconductor optical device according to the first embodiment of the present invention.
Figure 9:
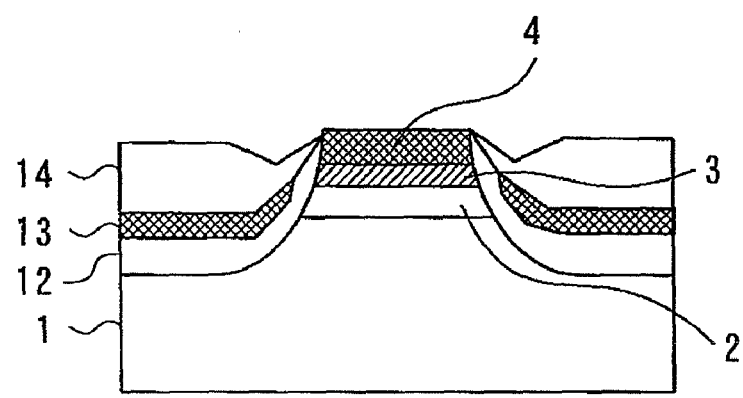
FIG. 9 show a process flow for manufacturing the semiconductor optical device according to the first embodiment of the present invention.

After the growth of the undoped InP layer 7 described above, the $SiO_2$ insulating film 22 is etched away. An $SiO_2$ insulating film 23 is then formed and patterned to produce the structure shown in FIG. 6. Next, a ridge is formed by wet etching, etc., as shown in FIG. 7. Further, the P-type InP buried layer 12, an N-type InP blocking layer 13 serving as the buried layer 13, and the semi-insulating Fe-doped InP buried layer 14 are grown by MOCVD, as shown in FIG. 8. The $SiO_2$ insulating film 23 is then etched away, as shown in FIG. 9.

Figure 10:
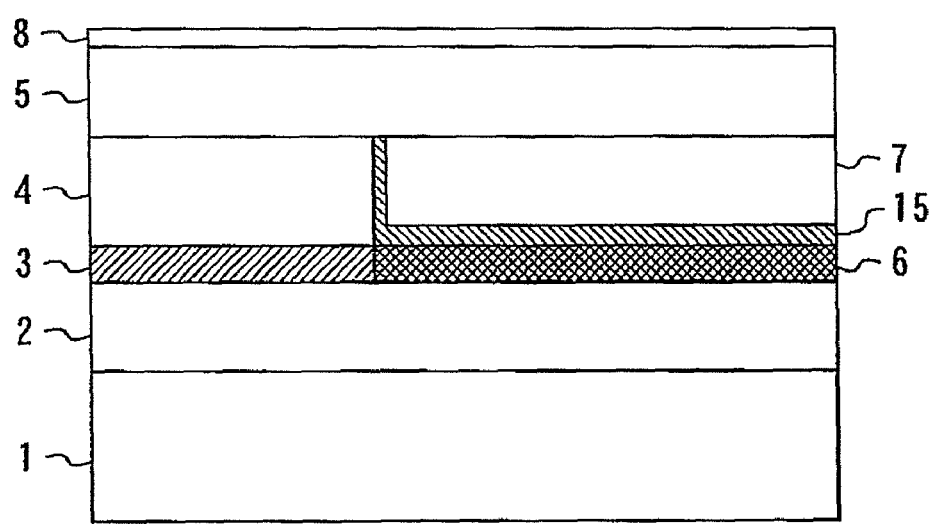
FIG. 10 show a process flow for manufacturing the semiconductor optical device according to the first embodiment of the present invention.
Figure 11:
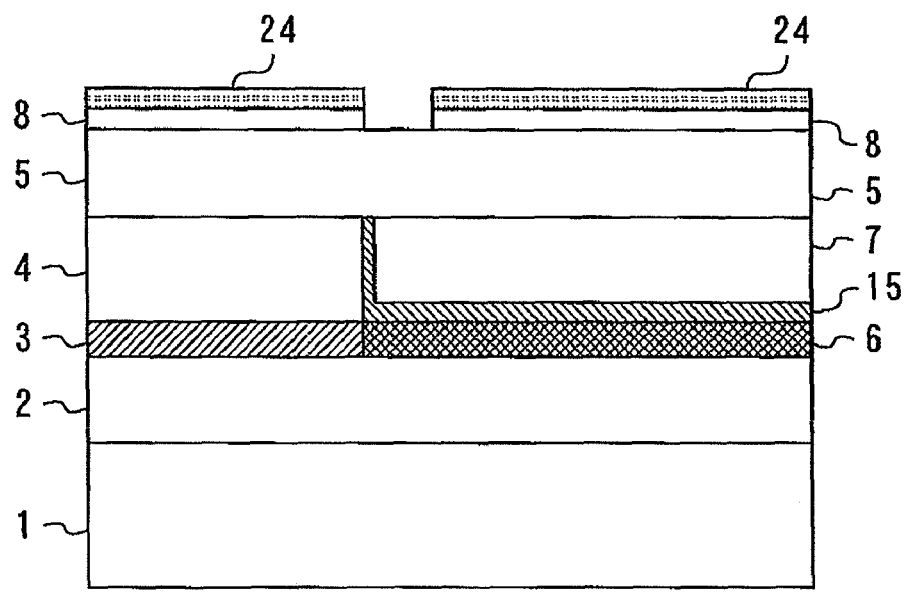
FIG. 11 show a process flow for manufacturing the semiconductor optical device according to the first embodiment of the present invention.
Figure 12:
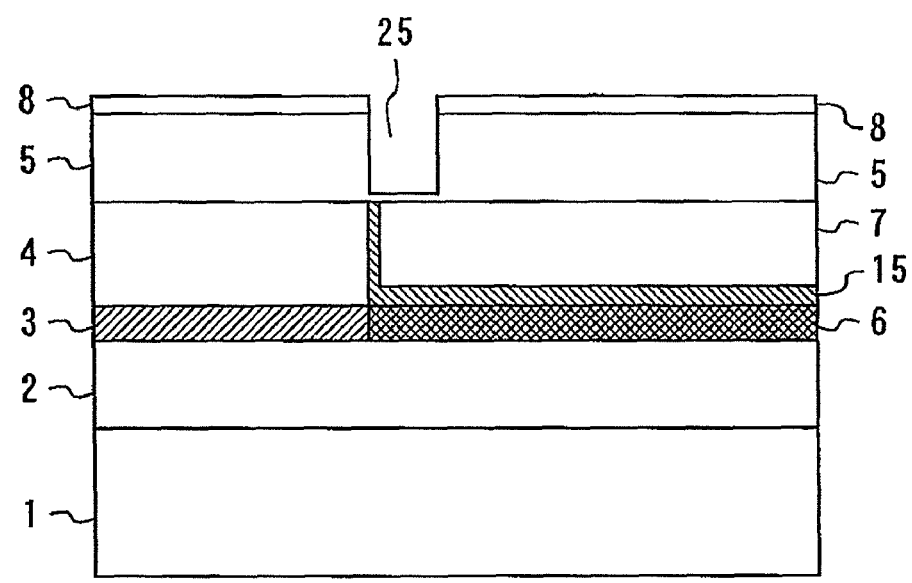
FIG. 12 show a process flow for manufacturing the semiconductor optical device according to the first embodiment of the present invention.
Figure 13:
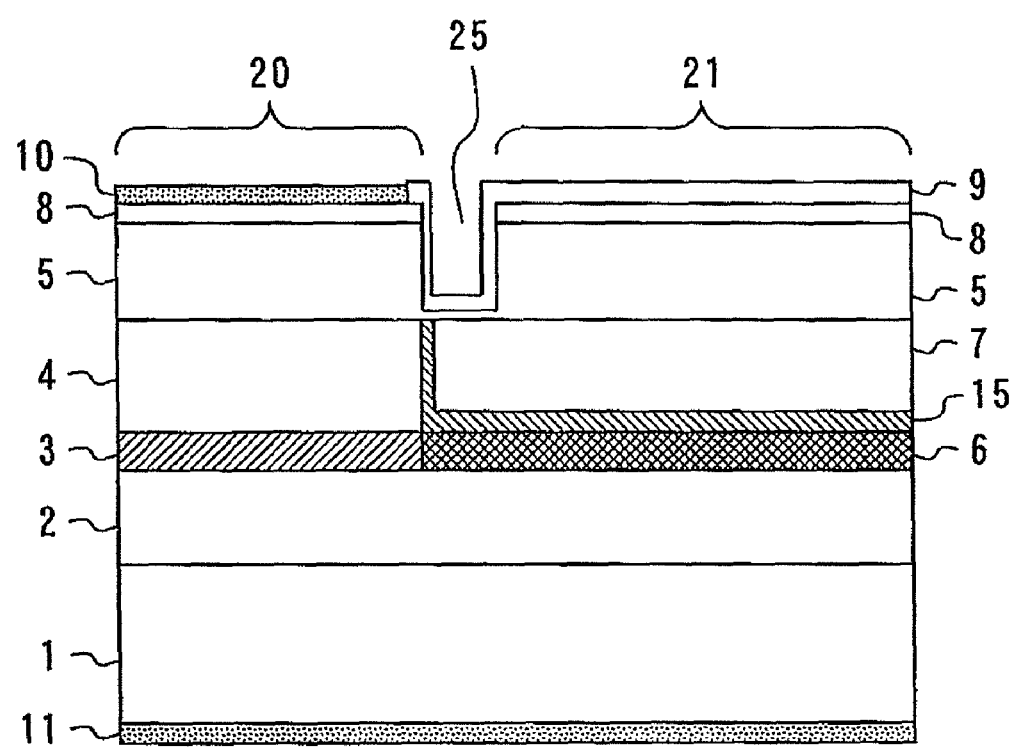
FIG. 13 show a process flow for manufacturing the semiconductor optical device according to the first embodiment of the present invention.

Then as shown in FIG. 10, the N-type InP layer 5 and the N-type InP contact layer 8 are grown by MOCVD. Next, an $SiO_2$ insulating film 24 is formed and patterned, as shown in FIG. 11. The separating trench 25 is then formed by dry etching, etc., and the $SiO_2$ insulating film 24 is etched away, producing the structure shown in FIG. 12. Then as shown in FIG. 13, an $SiO_2$ insulating film 9 is formed, and the P-type electrode (Ti/Pt/Au) 11 and N-type electrode (Ti/Pt/Au) 10 are also formed. This completes the formation of the laser portion 20 and the optical waveguide portion 21.

For example, the following raw material gases may be used by the manufacturing method of the present embodiment employing MOCVD.

In source: trimethylindium
Ga source: triethylgallium
Al source: trimethylaluminum
As source: arsine
P source: phosphine
Fe source: ferrocene
P-type dopant source: diethylzinc
N-type dopant source: hydrogen sulfide The thickness of each layer in the first embodiment is, e.g., as follows: active layer 3, 0.2 μm; optical guiding layer 6, 0.2 μm; cladding layer 4, 1 μm; high resistance layer 15, 100 nm.

Second Embodiment

Figure 17:
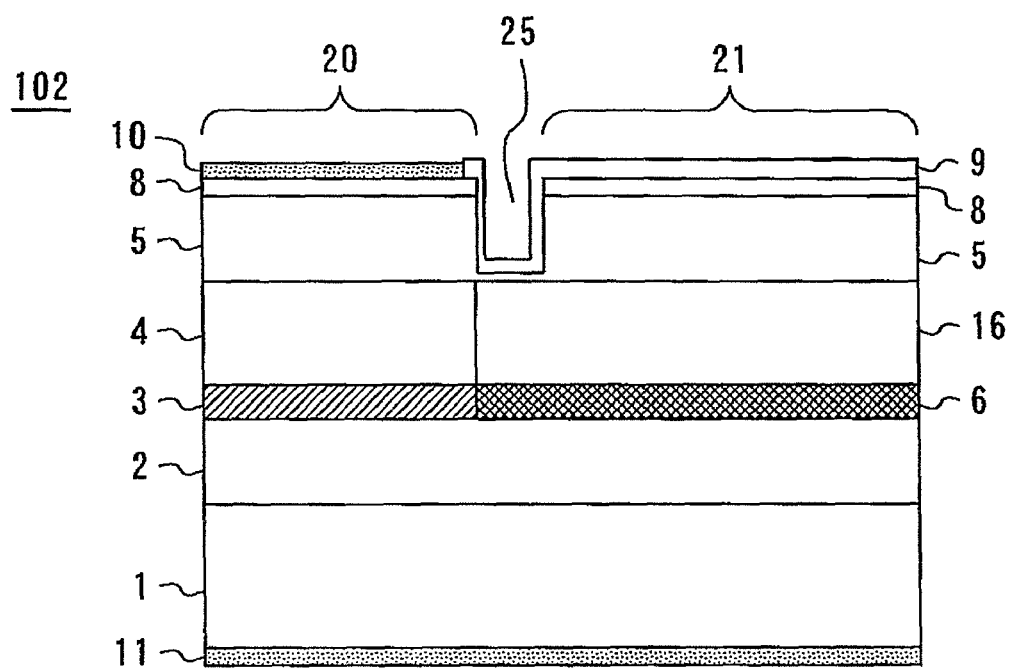
FIG. 17 is a diagram showing the configuration of an optical waveguide integrated semiconductor optical device according to a second embodiment of the present invention.

FIG. 17 is a diagram showing the configuration of an optical waveguide integrated semiconductor optical device 102 (hereinafter also referred to simply as "semiconductor optical device 102") according to a second embodiment of the present invention. The configuration of the semiconductor optical device 102 is similar to that of the semiconductor optical device 101, except that it does not include the high resistance layer 15 but instead includes a semi-insulating InP layer 16 in the optical waveguide portion 21. In the following description, like numerals will be used to represent like or corresponding components in order to avoid undue repetition; explanation of these components may be omitted or simplified when appropriate.

In the first embodiment, the high resistance layer 15 is used to block a leakage current. In the second embodiment, which is constructed differently from the first embodiment, on the other hand, the semi-insulating InP layer 16 is used to block a leakage current.

The semi-insulating InP layer 16 may be, e.g., an Fe-doped InP layer or an Ru-doped InP layer. The semi-insulating InP layer 16 functions such that electrons do not flow from the cladding layer 4 to the semi-insulating InP layer 16 and from the semi-insulating InP layer 16 to the optical guiding layer 6. This allows a reduction in the leakage current, thereby improving the current-optical output characteristics of the laser portion 20.

The following should be noted: the semiconductor substrate 1 of the second embodiment described above corresponds to the semiconductor substrate of the second aspect of the present invention described in the Summary of the Invention section; the laser portion 20, the optical active device portion; the optical waveguide portion 21, the optical waveguide portion; and the semi-insulating InP layer 16, the second cladding layer.

Third Embodiment

Figure 18:
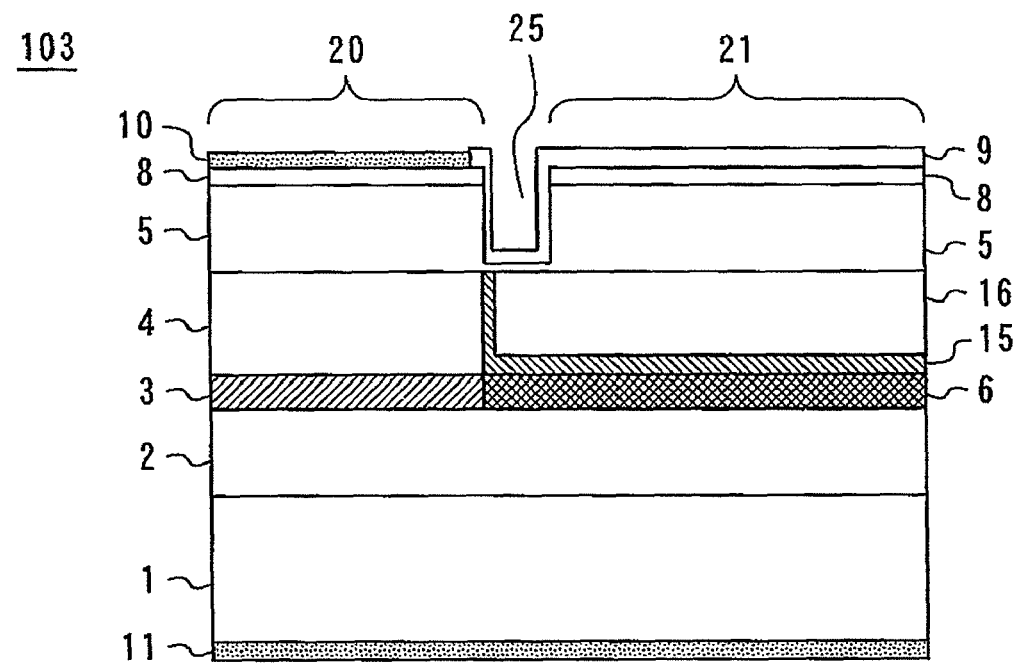
FIG. 18 is a diagram showing the configuration of an optical waveguide integrated semiconductor optical device according to a third embodiment of the present invention.

FIG. 18 is a diagram showing the configuration of an optical waveguide integrated semiconductor optical device 103 (hereinafter also referred to simply as "semiconductor optical device 103") according to a third embodiment of the present invention. The configuration of the semiconductor optical device 103 is similar to that of the semiconductor optical device 101, except that the undoped InP layer 7 is replaced by a semi-insulating InP layer 16.

Since the semiconductor optical device 103 includes both the high resistance layer 15 and the semi-insulating InP layer 16, the flow of electrons between the cladding layer 4 and the optical guiding layer 6 is more effectively prevented. This allows a reduction in the leakage current, thereby improving the current-optical output characteristics of the laser portion 20.

Fourth Embodiment

Figure 19:
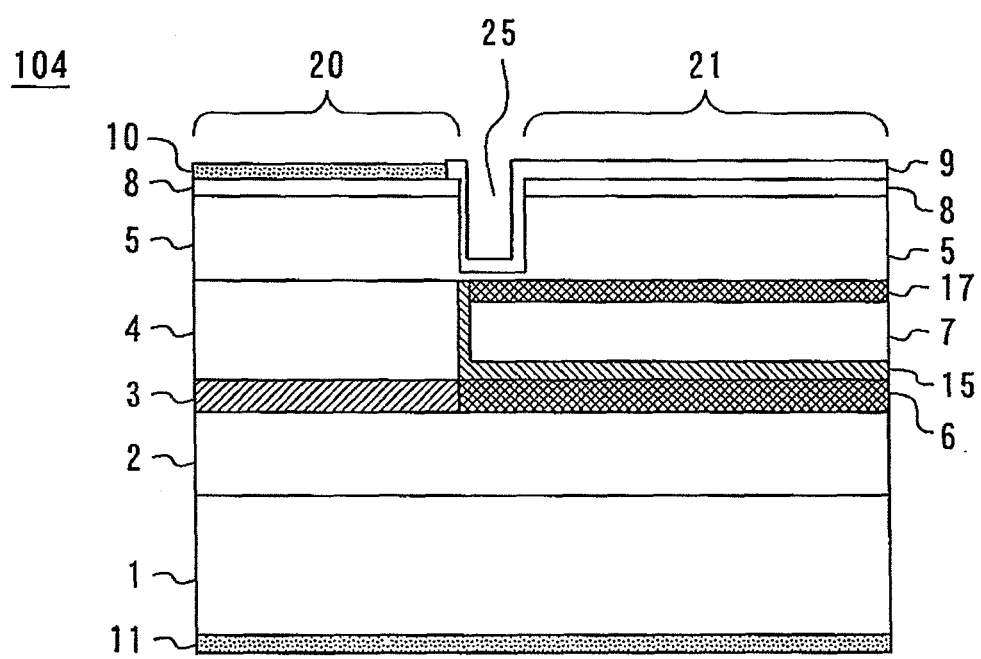
FIG. 19 is a diagram showing the configuration of an optical waveguide integrated semiconductor optical device according to a fourth embodiment of the present invention.

FIG. 19 is a diagram showing the configuration of an optical waveguide integrated semiconductor optical device 104 (hereinafter also referred to simply as "semiconductor optical device 104") according to a fourth embodiment of the present invention. The configuration of the semiconductor optical device 104 is similar to that of the semiconductor optical device 101, except that it includes a high resistance layer 17.

The high resistance layer 17 is provided on the top surface of the undoped InP layer 7, as shown in FIG. 19. According to the fourth embodiment, the high resistance layer 17 is an Al(Ga)InAs layer as is the high resistance layer 15. The Al(Ga)InAs layer serving as the high resistance layer 17 may be n-doped, undoped, p-doped, Fe-doped, or oxygen-doped. However, the electrical resistivities of the resulting doped Al(Ga)InAs layers are progressively higher in the order named. The high resistance layers 15 and 17 may be made of different materials and may be differently doped. Further, the oxygen doping, if used, may be accomplished by means of the low V/III ratio technique or the low temperature growth technique described in connection with the first embodiment.

The high resistance layer 17 blocks the flow of electrons from the N-type InP layer 5 to the undoped InP layer 7. More specifically, refer now to FIG. 16 which shows the comparative semiconductor optical device 200. In this comparative semiconductor optical device, a leakage current flows through the N-type InP layer 5, as indicated by arrowed broken lines. The high resistance layer 17 of the semiconductor optical device 104 of the fourth embodiment acts to reduce such a leakage current. Therefore, in the fourth embodiment, the high resistance layer 17, as well as the high resistance layer 15, has a leakage current reduction function. This makes it possible to further improve the current-optical output characteristics of the laser portion 20.

Fifth Embodiment

Figure 20:
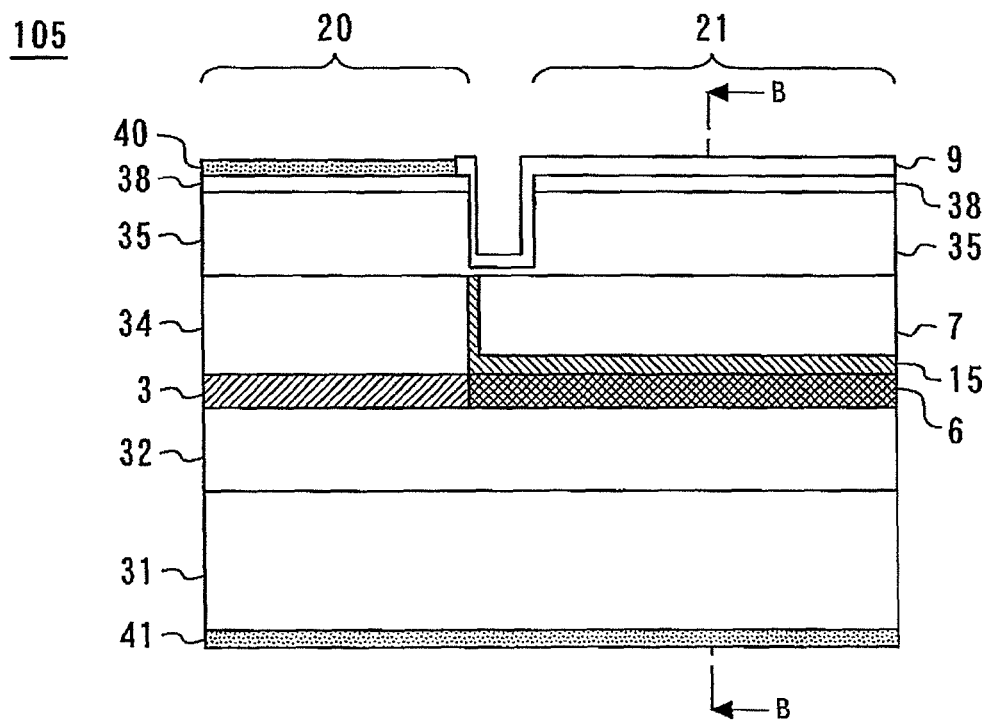
FIG. 20 is a diagram showing the configuration of an optical waveguide integrated semiconductor optical device according to a fifth embodiment of the present invention.

FIG. 20 is a diagram showing the configuration of an optical waveguide integrated semiconductor optical device 105 (hereinafter also referred to simply as "semiconductor optical device 105") according to a fifth embodiment of the present invention. The semiconductor optical devices of the first to fourth embodiments described above use a P-type InP substrate as the semiconductor substrate 1. On the other hand, the fifth embodiment and the sixth to eighth embodiments of the present invention (described later) use an N-type InP substrate as the semiconductor substrate 1.

As shown in FIG. 20, the semiconductor optical device 105 includes a semiconductor substrate 31 which is an N-type InP substrate. A cladding layer 32, an active layer 3, and a cladding layer 34 are stacked on the semiconductor substrate 31. The cladding layer 32 is an N-type InP cladding layer (having an N-type carrier concentration of $1 \times 10^{18}$ cm$^{-3}$), the active layer 3 is an AlGaInAs strained quantum well layer, and the cladding layer 34 is a P-type InP cladding layer (having a P-type carrier concentration of $1 \times 10^{18}$ cm$^{-3}$). Further, an optical guiding layer 6 is provided on the cladding layer 32 adjacent the active layer 3. The optical guiding layer 6 is an InGaAsP layer, as in the first to fourth embodiments.

A high resistance layer 15 and an undoped InP layer 7 are stacked on the optical guiding layer 6, as in the first embodiment. The detailed configuration of the high resistance layer 15 is the same as in the embodiments described above.

A P-type InP layer 35 is provided on the top surface of the cladding layer 34 and on the top surface of the undoped InP layer 7. A separating trench is provided in the P-type InP layer 35. The P-type InP layer 35 has a P-type carrier concentration of $1 \times 10^{18}$ cm$^{-3}$. A contact layer 38, an SiO$_2$ insulating film 9, a P-type electrode 40 are provided on the P-type InP layer 35. The contact layer 38 is a P-type InGaAs contact layer (having a P-type carrier concentration of $1 \times 10^{18}$ cm$^{-3}$), and the P-type electrode 40 is made of Ti/Pt/Au. Further, an N-type electrode 41 (Ti/Pt/Au) is provided on the bottom surface of the semiconductor substrate 31. Thus, the laser portion 20 and the optical waveguide portion 21 are integrated on the semiconductor substrate 31 in the semiconductor optical device 105.

Figure 21:
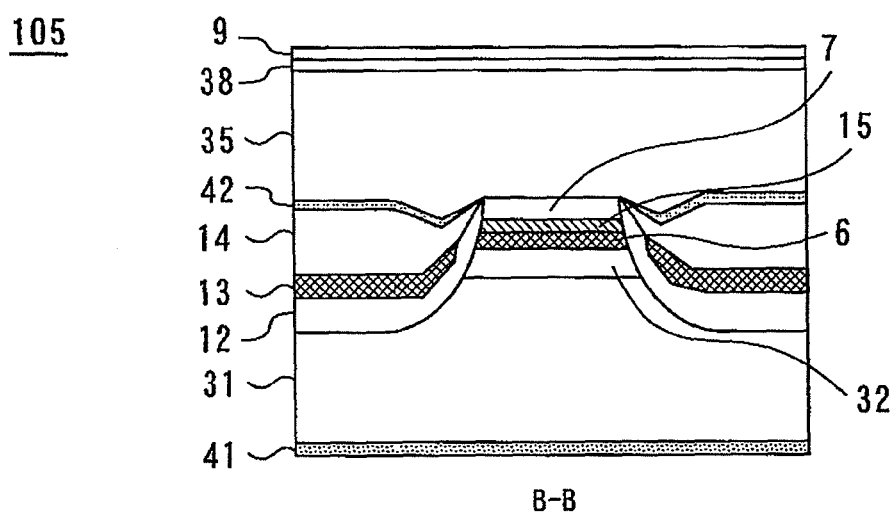
FIG. 21 shows a cross section of the semiconductor optical device taken along line B-B of FIG. 17 according to the fifth embodiment of the present invention.

FIG. 21 is a cross section of the semiconductor optical device 105 taken along line B-B of FIG. 20. That is, FIG. 21 is a cross-sectional view of the optical waveguide portion 21 shown in FIG. 20 taken perpendicular to the direction of the resonator. As shown in FIG. 21, the optical waveguide portion 21 of the semiconductor optical device 105 includes buried layers 12, 13, 14, and 42. The buried layers 12, 13, and 14 are the same as those described in connection with the first embodiment. On the other hand, the buried layer 42 is an N-type InP buried layer (having an N-type carrier concentration of $1 \times 10^{19}$ cm$^{-3}$).

The high resistance layer 15 is an Al(Ga)InAs layer, as in the first embodiment. The high resistance layer 15 blocks the flow of leakage current passing between the cladding layer 34 and the optical guiding layer 6 through the undoped InP layer 7. This allows a reduction in the leakage current, thereby improving the current-optical output characteristics of the laser portion 20.

Sixth Embodiment

Figure 22:
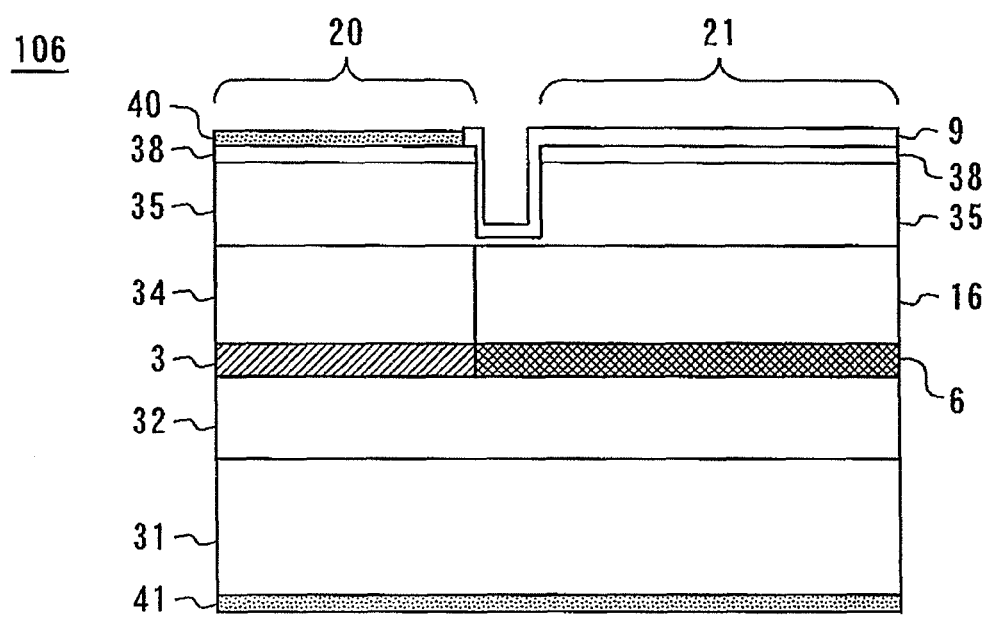
FIG. 22 is a diagram showing the configuration of an optical waveguide integrated semiconductor optical device according to a sixth embodiment of the present invention.

FIG. 22 is a diagram showing the configuration of an optical waveguide integrated semiconductor optical device 106 (hereinafter also referred to simply as "semiconductor optical device 106") according to a sixth embodiment of the present invention. The semiconductor optical device 106 includes, as does the semiconductor optical device 105 of the fifth embodiment, a semiconductor substrate 31 which is an N-type InP substrate.

The semiconductor optical device 106 is basically similar to the semiconductor optical device 102 of the second embodiment, except that the P-type InP substrate is replaced by an N-type InP substrate, and the layers adapted to the P-type InP substrate are also replaced by layers adapted to the N-type InP substrate. That is, the semiconductor optical device 106 includes, as does the semiconductor optical device 102 of the second embodiment, a semi-insulating InP layer 16 made up of, e.g., an Fe-doped InP layer or a Ru-doped InP layer. The detailed configuration of the semi-insulating InP layer 16 is the same as in the embodiments described above.

The high resistance of the semi-insulating InP layer 16 acts to reduce the flow of leakage current passing between the cladding layer 34 and the optical guiding layer 6 through the semi-insulating InP layer 16. This allows a reduction in the leakage current, thereby improving the current-optical output characteristics of the laser portion 20.

Seventh Embodiment

Figure 23:
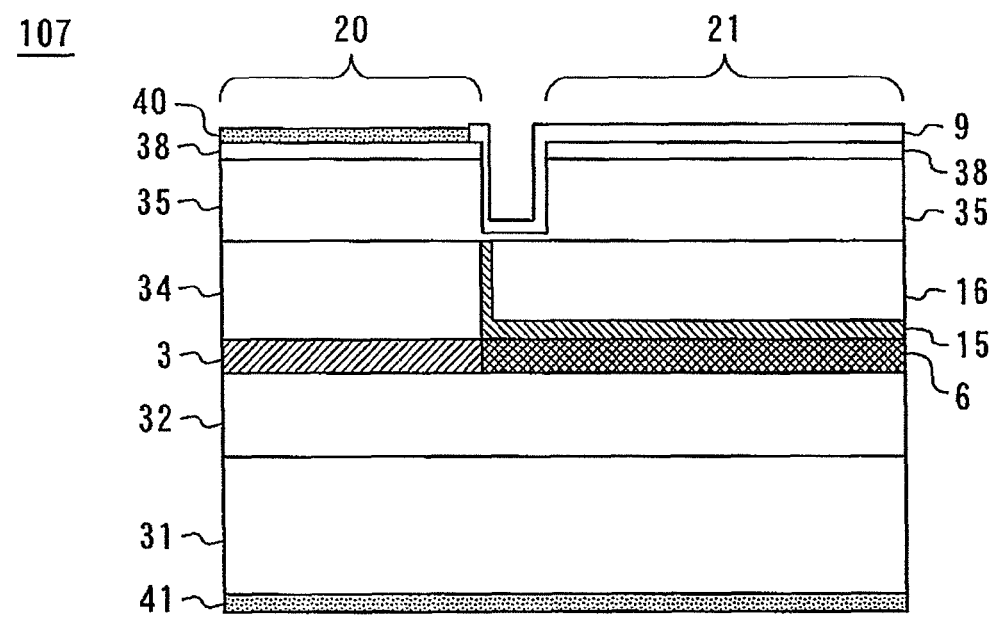
FIG. 23 is a diagram showing the configuration of an optical waveguide integrated semiconductor optical device according to a seventh embodiment of the present invention.

FIG. 23 is a diagram showing the configuration of an optical waveguide integrated semiconductor optical device 107 (hereinafter also referred to simply as "semiconductor optical device 107") according to a seventh embodiment of the present invention. The semiconductor optical device 107 includes, as do the semiconductor optical devices of the fifth and sixth embodiments, a semiconductor substrate 31 which is an N-type InP substrate.

The semiconductor optical device 107 is basically similar to the semiconductor optical device 103 of the third embodiment, except that the P-type InP substrate is replaced by an N-type InP substrate, and the layers adapted to the P-type InP substrate are also replaced by layers adapted to the N-type InP substrate. That is, the semiconductor optical device 107 includes both the high resistance layer 15 and the semi-insulating InP layer 16. The detailed configurations of the high resistance layer 15 and the semi-insulating InP layer 16 are the same as in the embodiments described above.

Since the semiconductor optical device 107 includes both the high resistance layer 15 and the semi-insulating InP layer 16, the flow of leakage current between the cladding layer 34 and the optical guiding layer 6 is more effectively prevented. This allows a reduction in the leakage current, thereby improving the current-optical output characteristics of the laser portion 20.

Eighth Embodiment

Figure 24:
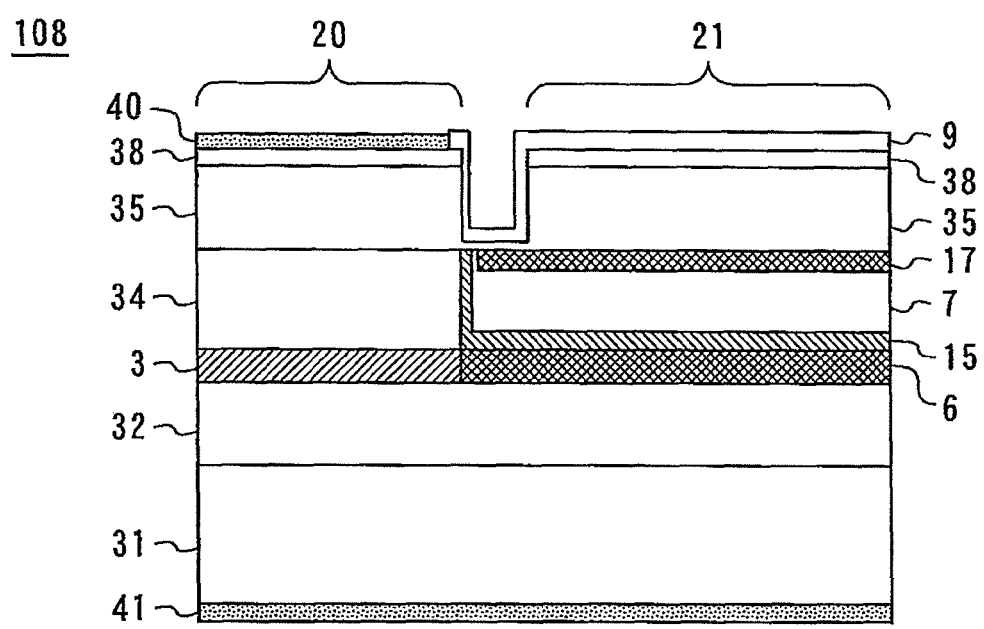
FIG. 24 is a diagram showing the configuration of an optical waveguide integrated semiconductor optical device according to a eighth embodiment of the present invention.

FIG. 24 is a diagram showing the configuration of an optical waveguide integrated semiconductor optical device 108 (hereinafter also referred to simply as "semiconductor optical device 108") according to an eighth embodiment of the present invention. The semiconductor optical device 108 includes, as do the semiconductor optical devices of the fifth to seventh embodiments, a semiconductor substrate 31 which is an N-type InP substrate.

The semiconductor optical device 108 includes a high resistance layer 17 on the top surface of the undoped InP layer 7, as shown in FIG. 24. That is, the semiconductor optical device 108 is similar to the semiconductor optical device 105 of the fifth embodiment, except that it includes the high resistance layer 17 described in connection with the fourth embodiment.

The high resistance layer 17 blocks the flow of leakage current between the P-type InP layer 35 and the undoped InP layer 7. Therefore, the high resistance layer 17, as well as the high resistance layer 15, has a leakage current reduction function. This makes it possible to further improve the current-optical output characteristics of the laser portion 20.

It will be noted that the semiconductor optical devices 101 to 108 of the first to eighth embodiments are optical waveguide integrated semiconductor optical devices in which the laser portion 20, which is an optical active device, and the optical waveguide portion 21 are integrated on the substrate. However, the present invention is not limited to this particular construction. The high resistance layer 15 or 17 or the semi-insulating InP layer 16 may be incorporated, alone or in combination, into a construction in which an optical active device such as an optical modulator or an optical amplifier and an optical waveguide are integrated and formed adjacent each other, as in the constructions described in connection with the first to eighth embodiments.

Further, the optical waveguide integrated semiconductor optical devices of the present invention may be made of materials other than those specified in connection with the first embodiment. That is, for example, the laser portion 20 and the optical waveguide portion 21 may be made of one or more suitable semiconductor materials, including, but not limited to, IP, AlGaInAs, InGaAs, InGaAsP, AlInAs, AlGaAs, GaAs, AlGaInP, InGaP, AlGaN, GaN, and InGaN. In such cases, the high resistance layer 15 which covers a side of the cladding layer 4 and the top surface of the optical guiding layer 6 may also be made of a suitable material and doped with a suitable dopant. Specifically, for example, the high resistance layer 15 may be made of oxygen-doped AlGaAs.

Optimum growth temperatures for semiconductor materials are as follows: 600-630° C. for InP, InGaAsP, and InGaAs; 600-750° C. for AlGaInAs and AlInAs; 650-750° C. for AlGaAs, GaAs, AlGaInP, and InGaP; 1000-1100° C. for AlGaN and GaN; 700-800° C. for InGaN. When the high resistance layer 15 is grown at a low growth temperature by the manufacturing method of the first embodiment described above, this low growth temperature may be lower than the lower limit of the above optimum growth temperature range for the material of the high resistance layer 15.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2009-157479, filed on Jul. 2, 2009 including specification, claims, drawings and summary, on which the Convention priority of the present application is based, are incorporated herein by reference in its entirety.

The invention claimed is:

1. An optical waveguide integrated semiconductor optical device comprising:
   a semiconductor substrate having a first conductivity type;
   an optical active device located on said semiconductor substrate and including a first cladding layer of the first conductivity type, an active layer, and a second cladding layer of a second conductivity type, opposite the first conductivity type, stacked on said semiconductor substrate, in that order;
   an optical waveguide located on said semiconductor substrate, adjacent said optical active device, said optical waveguide including a first cladding layer of the first conductivity type and that is continuous with said first cladding layer of said optical active device, an optical guiding layer, and a second cladding layer, stacked on said semiconductor substrate, in that order, such that said optical guiding layer is in contact with and optically coupled to said active layer of said optical active device; and
   a first high resistance layer, higher in electrical resistivity than said second cladding layer, wherein
      said first high resistance layer is interposed between and contacts each of said second cladding layer of said optical waveguide and said optical guiding layer of said optical waveguide, and electrically isolates said second cladding layer of said optical waveguide from said optical guiding layer of said optical waveguide, and
      said first high resistance layer is interposed between and contacts each of said second cladding layer of said optical active device and said second cladding layer of said optical waveguide, and electrically isolates said second cladding layer of said optical active device from said second cladding layer of said optical waveguide.

2. The optical waveguide integrated semiconductor optical device according to claim 1, wherein:
   said optical active device is a laser device, and said active layer of said optical active device has an end face transverse to said semiconductor substrate for emitting a laser beam;
   said optical guiding layer of said optical waveguide has an end face in contact with said end face of said active layer of said laser device;
   said second cladding layer of said optical waveguide has a side;
   said second cladding layer of said optical active device has a side transverse to said semiconductor substrate and directly opposite said side of said second cladding layer of said optical waveguide; and
   said first high resistance layer is interposed between said side of said second cladding layer of said optical active device and said side of said second cladding layer of said optical waveguide.

3. The optical waveguide integrated semiconductor optical device according to claim 2, wherein said first high resistance layer is a layer epitaxially grown on and in contact with a top surface of said optical guiding layer in said optical waveguide, said top surface being generally parallel to said semiconductor substrate, and on and in contact with said side of said second cladding layer of said optical active device such that said first high resistance layer covers both said top surface of said optical guiding layer in said optical waveguide and said side of said second cladding layer of said optical active device.

4. The optical waveguide integrated semiconductor optical device according to claim 1, wherein said first high resistance layer is Al(Ga)InAs.

5. The optical waveguide integrated semiconductor optical device according to claim 1, wherein said first high resistance layer contains a group V element and a group III element, and the ratio of the group V element to the group III element of said first high resistance layer is low enough that said first high resistance layer undergoes oxygen doping.

6. The optical waveguide integrated semiconductor optical device according to claim 5, wherein the ratio of the group V element to the group III element of said first high resistance layer is no more than 100.

7. The optical waveguide integrated semiconductor optical device according to claim 1, wherein said second cladding layer of said optical waveguide is a semi-insulating semiconductor material.

8. The optical waveguide integrated semiconductor optical device according to claim 1, further comprising a second high resistance layer, higher in electrical resistivity than said second cladding layer of said optical waveguide, wherein said second high resistance layer is located on an opposite side of said second cladding layer of said optical waveguide from part of said first high resistance layer that is interposed between and in contact with each of said second cladding layer of said optical waveguide and said optical guiding layer of said optical waveguide, so that said second cladding layer of said optical waveguide is sandwiched by said first and second high resistance layers.

9. An optical waveguide integrated semiconductor optical device comprising:
   a semiconductor substrate having a first conductivity type;
   an optical active device located on said semiconductor substrate and including a first cladding layer of the first conductivity type, an active layer, and a second cladding layer of a second conductivity type, opposite the first conductivity type, stacked on said semiconductor substrate, in that order; and
   an optical waveguide located on said semiconductor substrate, adjacent said optical active device, wherein said optical waveguide includes a first cladding layer of the first conductivity type and that is continuous with said first cladding layer of said optical active device, an optical guiding layer, and a semi-insulating second cladding layer, stacked on said semiconductor substrate, in that order, such that said optical guiding layer is in contact with and optically coupled to said active layer of said optical active device and said second cladding layer of said optical active device is in contact with said semi-insulating second cladding layer of said optical waveguide device.

10. The optical waveguide integrated semiconductor optical device according to claim 9, wherein:
   said optical active device is a laser device including an InP first cladding layer, an AlGaInAs active layer, and an InP second cladding layer, said AlGaInAs active layer having an end face for emitting a laser beam;
   said optical guiding layer is an InGaAsP layer, and an end face of said optical guiding layer is in contact with said end face of said active layer; and
   said semi-insulating second cladding layer is an Fe— or Ru-doped InP layer.

11. The optical waveguide integrated semiconductor optical device according to claim 1, wherein:
   said second cladding layer of said optical active device has a side and said second cladding layer of said optical waveguide has a side;
   said side of said second cladding layer of said optical active device is directly opposite said side of said second cladding layer of said optical waveguide; and
   said first high resistance layer continuously extends across and between said second cladding layer of said optical waveguide and said optical guiding layer of said optical waveguide, and between said side of said second cladding layer of said optical waveguide and said side of said second cladding layer of said optical active device.

* * * * *